(12) United States Patent
Abuelma'atti et al.

(10) Patent No.: US 8,917,146 B1
(45) Date of Patent: Dec. 23, 2014

(54) CURRENT-CONTROLLED OPERATIONAL TRANSCONDUCTANCE AMPLIFIER BASED SINUSOIDAL OSCILLATOR CIRCUIT

(71) Applicant: King Fahd University of Petroleum and Minerals, Dhahran (SA)

(72) Inventors: Muhammad Taher Abuelma'atti, Dhahran (SA); Zainulabideen Jamal Khalifa, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/182,597

(22) Filed: Feb. 18, 2014

(51) Int. Cl.
*H03B 5/02* (2006.01)
(52) U.S. Cl.
CPC .......................................... *H03B 5/02* (2013.01)
USPC .................... 331/107 R; 331/135; 331/177 R
(58) Field of Classification Search
USPC ............... 331/107 R, 108 B, 135–137, 177 R
See application file for complete search history.

(56) References Cited

U.S. PATENT DOCUMENTS

| | | | | |
|---|---|---|---|---|
| 4,760,353 | A * | 7/1988 | Perkins | 331/132 |
| 5,093,634 | A * | 3/1992 | Khoury | 331/108 B |
| 5,343,170 | A * | 8/1994 | Lee | 331/132 |
| 5,414,392 | A * | 5/1995 | Schupak | 332/118 |
| 5,917,383 | A * | 6/1999 | Tso et al. | 331/57 |
| 6,469,585 | B1 * | 10/2002 | Dai et al. | 331/57 |
| 6,504,436 | B2 * | 1/2003 | Horikawa et al. | 331/11 |
| 6,727,768 | B1 * | 4/2004 | Dasgupta | 331/143 |
| 7,218,179 | B2 * | 5/2007 | Crawley | 331/57 |
| 7,741,920 | B2 * | 6/2010 | Westra | 331/36 C |
| 8,040,196 | B2 * | 10/2011 | Shin | 331/57 |
| 8,395,456 | B2 * | 3/2013 | Badillo et al. | 331/116 R |
| 2002/0089381 | A1 * | 7/2002 | Mullgrav et al. | 331/17 |
| 2010/0031205 | A1 | 2/2010 | Chang et al. | |
| 2010/0264996 | A1 | 10/2010 | Chang et al. | |

* cited by examiner

*Primary Examiner* — Levi Gannon
(74) *Attorney, Agent, or Firm* — Oblon, Spivak, McClelland, Maier & Neustadt, L.L.P.

(57) ABSTRACT

A current controlled operational transconductance amplifier based sinusoidal oscillator circuit that provides oscillation based on the transconductance and parasitic capacitance of the operational transconductance amplifier without externally connected capacitances. The oscillation frequency is adjusted through a variable current source or a variable resistor with a DC voltage source.

11 Claims, 4 Drawing Sheets

US 8,917,146 B1

CURRENT-CONTROLLED OPERATIONAL TRANSCONDUCTANCE AMPLIFIER BASED SINUSOIDAL OSCILLATOR CIRCUIT

BACKGROUND

1. Field of the Disclosure

The exemplary implementations described herein relate to a current-controlled operational transconductance amplifier based oscillator circuit.

2. Description of the Related Art

Over the years researchers have developed minimum-component sinusoidal oscillator circuits. Inspection of the circuits reported in references Abuelma'atti et al., ("A novel single-capacitor single-operational-amplifier sinusoidal oscillator", IEEE Transactions on Education, Vol. 38, 1995, pp. 391-393—incorporated herein by reference), Abuelma'atti, et al., ("Two-component oscillator", Electronics World, July/August 1996, p. 61—incorporated herein by reference), Abuelma'atti et al., ("Novel RC oscillators using the current-feedback operational amplifier", IEEE Transactions on Circuits and Systems—I: Fundamental Theory and Applications, Vol. 43, 1996, pp. 155-157—incorporated herein by reference), Abuelma'atti et al., ("Grounded capacitor oscillators using a single operational transconductance amplifier," Active and Passive Electronic Components, Vol. 19, 1996, pp. 91-98—incorporated herein by reference), Abuelma'atti et al., ("Partially active-R grounded-capacitor CFOA-based sinusoidal oscillators", Active and Passive Electronic Components, Vol. 19, 1996, pp. 105-109—incorporated herein by reference), Abuelma'atti et al., ("A novel low-component-count single-element-controlled sinusoidal oscillator using the CFOA pole", International Journal of Electronics", Vol. 80, 1996, pp. 747-752—incorporated herein by reference), Abuelma'atti et al., ("A novel single-element controlled oscillator using the current-feedback-operational amplifier pole", FREQUENZ, Vol. 50, 1996, pp. 183-184—incorporated herein by reference), Abuelma'atti et al., ("Grounded capacitor oscillators using a single operational transconductance amplifier", FREQUENZ, Vol. 50, 1996, pp. 294-297—incorporated herein by reference), Abuelma'atti et al., ("New CFOA-based grounded-capacitor single-element-controlled sinusoidal oscillator", Active and Passive Electronic Components, Vol. 20, 1997, pp. 119-124—incorporated herein by reference), Abuelma'atti et al., ("Oscillator uses feedback poles", Electronic Engineering, Vol. 69, November 1997, pp. 20-24—incorporated herein by reference), Abuelma'atti et al., ("Two-minimum-component single current conveyor RC oscillators", International Journal of Electronics, Vol. 63, 1987, pp. 509-512—incorporated herein by reference), Abuelma'atti et al., ("Two new minimum-component Wien-bridge oscillators using current conveyors", International Journal of Electronics, Vol. 63, 1987, pp. 669-672—incorporated herein by reference), Stoner et al., ("Electronically tunable simple oscillator based on single-output and multiple-output transconductor", IEICE Electronics Express, Vol. 6, 2009, pp. 1476-1482—incorporated herein by reference), Abuelma'atti et al., ("New minimum-component OTA-based sinusoidal oscillators", Active and Passive Electronic Components, Vol. 19, 1996, pp. 33-40—incorporated herein by reference), Abuelma'atti et al., ("New minimum component electronically tunable OTA-C sinusoidal oscillators", Electronics Letters, Vol. 25, 1989, pp. 1114-1115—incorporated herein by reference) and Abuelma'atti et al., ("A new minimum component active-C OTA-based linear voltage (current)-controlled sinusoidal oscillator", IEEE Transactions on Instrumentation and Measurement, Vol. 39, 1990, pp. 795-797—incorporated herein by reference), Chang et al., ("Novel sinusoidal oscillators using a single dual current output OTA", International Journal of Electronics, Vol. 89, 2002, pp. 493-503—incorporated herein by reference), and Bhaskar et al., ("Electronically-controlled current-mode second order sinusoidal oscillators using MO-OTAs and grounded capacitors", Circuits and Systems, Vol. 2, 2011, pp. 65-73—incorporated herein by reference) shows that they suffer from one or more of the following drawbacks.

Reference such as Abuelma'atti et al., ("New minimum-component OTA-based sinusoidal oscillators", Active and Passive Electronic Components, Vol. 19, 1996, pp. 33-40—incorporated herein by reference), Abuelma'atti et al., ("New minimum component electronically tunable OTA-C sinusoidal oscillators", Electronics Letters, Vol. 25, 1989, pp. 1114-1115—incorporated herein by reference) and Abuelma'atti et al., ("A new minimum component active-C OTA-based linear voltage (current)-controlled sinusoidal oscillator", IEEE Transactions on Instrumentation and Measurement, Vol. 39, 1990, pp. 795-797—incorporated herein by reference) use more than one commercially available integrated circuit. Thus, it increases the DC power consumption.

References such as Stoner et al., ("Electronically tunable simple oscillator based on single-output and multiple-output transconductor", IEICE Electronics Express, Vol. 6, 2009, pp. 1476-1482—incorporated herein by reference), Chang et al., ("Novel sinusoidal oscillators using a single dual current output OTA", International Journal of Electronics, Vol. 89, 2002, pp. 493-503—incorporated herein by reference) and Bhaskar et al., ("Electronically-controlled current-mode second order sinusoidal oscillators using MO-OTAs and grounded capacitors", Circuits and Systems, Vol. 2, 2011, pp. 65-73—incorporated herein by reference) use commercially unavailable integrated circuits. While the commercially unavailable integrated circuits used in these references can be implemented using commercially available integrated circuits this would result in using an excessive number of commercially available integrated circuits.

Reference such as Abuelma'atti et al., ("A novel single-capacitor single-operational-amplifier sinusoidal oscillator", IEEE Transactions on Education, Vol. 38, 1995, pp. 391-393—incorporated herein by reference), Abuelma'atti et al., ("Partially active-R grounded-capacitor CFOA-based sinusoidal oscillators", Active and Passive Electronic Components, Vol. 19, 1996, pp. 105-109—incorporated herein by reference), Abuelma'atti et al., ("A novel single-element controlled oscillator using the current-feedback-operational amplifier pole", FREQUENZ, Vol. 50, 1996, pp. 183-184—incorporated herein by reference), Abuelma'atti et al., ("Grounded capacitor oscillators using a single operational transconductance amplifier", FREQUENZ, Vol. 50, 1996, pp. 294-297—incorporated herein by reference), Abuelma'atti et al., ("New CFOA-based grounded-capacitor single-element-controlled sinusoidal oscillator", Active and Passive Electronic Components, Vol. 20, 1997, pp. 119-124—incorporated herein by reference), Abuelma'atti et al., ("Two-minimum-component single current conveyor RC oscillators", International Journal of Electronics, Vol. 63, 1987, pp. 509-512—incorporated herein by reference), Abuelma'atti et al., ("Two new minimum-component Wien-bridge oscillators using current conveyors", International Journal of Electronics, Vol. 63, 1987, pp. 669-672—incorporated herein by reference) and Stoner et al., ("Electronically tunable simple oscillator based on single-output and multiple-output transconductor", IEICE Electronics Express, Vol. 6, 2009, pp. 1476-1482—incorporated herein by reference) use excessive number of passive elements. Thus, the chip in these references occupies relatively large area on the chip if integrated.

Reference such as Abuelma'atti et al., ("A novel single-capacitor single-operational-amplifier sinusoidal oscillator", IEEE Transactions on Education, Vol. 38, 1995, pp. 391-393—incorporated herein by reference), Abuelma'atti, et al., ("Two-component oscillator", Electronics World, July/August 1996, p. 61—incorporated herein by reference), Abuelma'atti et al., ("Novel RC oscillators using the current-feedback operational amplifier", IEEE Transactions on Circuits and Systems—I: Fundamental Theory and Applications, Vol. 43, 1996, pp. 155-157—incorporated herein by reference), Abuelma'atti et al., ("Partially active-R grounded-capacitor CFOA-based sinusoidal oscillators," Active and Passive Electronic Components", Vol. 19, 1996, pp. 105-109—incorporated herein by reference), Abuelma'atti et al., ("A novel low-component-count single-element-controlled sinusoidal oscillator using the CFOA pole", International Journal of Electronics, Vol. 80, 1996, pp. 747-752—incorporated herein by reference), Abuelma'atti et al., ("A Novel single-element controlled oscillator using the current-feedback-operational amplifier pole", FREQUENZ, Vol. 50, 1996, pp. 183-184—incorporated herein by reference), Abuelma'atti et al., ("New CFOA-based grounded-capacitor single-element-controlled sinusoidal oscillator", Active and Passive Electronic Components, Vol. 20, 1997, pp. 119-124—incorporated herein by reference), Abuelma'atti et al., ("Oscillator uses feedback poles", Electronic Engineering, Vol. 69, November 1997, pp. 20-24—incorporated herein by reference), Abuelma'atti et al., ("Two-minimum-component single current conveyor RC oscillators, International Journal of Electronics", Vol. 63, 1987, pp. 509-512—incorporated herein by reference) and Abuelma'atti et al., ("Two new minimum-component Wien-bridge oscillators using current conveyors", International Journal of Electronics, Vol. 63, 1987, pp. 669-672—incorporated herein by reference) lack electronic tuning, which is the frequency of oscillation cannot be controlled using a control voltage (current). While the circuits proposed in Abuelma'atti et al., ("A novel single-capacitor single-operational-amplifier sinusoidal oscillator, IEEE Transactions on Education", Vol. 38, 1995, pp. 391-393—incorporated herein by reference) uses one operational amplifier and one externally connected capacitor and the circuit proposed in Abuelma'atti et al., ("Oscillator uses feedback poles", Electronic Engineering, Vol. 69, November 1997, pp. 20-24—incorporated herein by reference) uses one current-feedback operational-amplifier, one externally connected resistor and one externally connected capacitor, both circuits does not enjoy electronic tuning.

Abuelma'atti et al., ("Novel RC oscillators using the current-feedback operational amplifier", IEEE Transactions on Circuits and Systems—I: Fundamental Theory and Applications, Vol. 43, 1996, pp. 155-157—incorporated herein by reference), Abuelma'atti et al., ("Grounded capacitor oscillators using a single operational transconductance amplifier, Active and Passive Electronic Components, Vol. 19, 1996, pp. 91-98—incorporated herein by reference), Abuelma'atti et al., ("Partially active-R grounded-capacitor CFOA-based sinusoidal oscillators", Active and Passive Electronic Components, Vol. 19, 1996, pp. 105-109—incorporated herein by reference), Abuelma'atti et al., ("A novel low-component-count single-element-controlled sinusoidal oscillator using the CFOA pole", International Journal of Electronics", Vol. 80, 1996, pp. 747-752—incorporated herein by reference), Abuelma'atti et al., ("A novel single-element controlled oscillator using the current-feedback-operational amplifier pole", FREQUENZ, Vol. 50, 1996, pp. 183-184—incorporated herein by reference), Abuelma'atti et al., ("Grounded capacitor oscillators using a single operational transconductance amplifier", FREQUENZ, Vol. 50, 1996, pp. 294-297—incorporated herein by reference), Abuelma'atti et al., ("New CFOA-based grounded-capacitor single-element-controlled sinusoidal oscillator", Active and Passive Electronic Components", Vol. 20, 1997, pp. 119-124—incorporated herein by reference), Abuelma'atti et al., ("Oscillator uses feedback poles", Electronic Engineering, Vol. 69, November 1997, pp. 20-24—incorporated herein by reference), Abuelma'atti et al., ("Two-minimum-component single current conveyor RC oscillators", International Journal of Electronics, Vol. 63, 1987, pp. 509-512—incorporated herein by reference), Abuelma'atti et al., ("Two new minimum-component Wien-bridge oscillators using current conveyors", International Journal of Electronics, Vol. 63, 1987, pp. 669-672—incorporated herein by reference), Abuelma'atti et al., ("New minimum component electronically tunable OTA-C sinusoidal oscillators", Electronics Letters, Vol. 25, 1989, pp. 1114-1115—incorporated herein by reference) and Chang et al., ("Novel sinusoidal oscillators using a single dual current output OTA", International Journal of Electronics, Vol. 89, 2002, pp. 493-503—incorporated herein by reference) use the floating passive elements and thus, limiting the frequency of oscillation.

SUMMARY

One embodiment of the disclosure includes a current controlled operational transconductance amplifier based sinusoidal oscillator circuit, including: a first power supply node; a first ground node; a first current control input node; a first output node; an operational transconductance amplifier having: a second power supply node coupled to the first power supply node of the current controlled operational transconductance amplifier based sinusoidal oscillator; a second ground node coupled to the first ground node of the current controlled operational transconductance amplifier based sinusoidal oscillator; a first non-inverting input coupled to the second ground node; a second current control input node coupled to the first current control input node of the current controlled operational transconductance amplifier based sinusoidal oscillator, a first inverting input node; a second output node coupled to the first inverting input node and the first output node of the current controlled operational transconductance amplifier based sinusoidal oscillator.

In one embodiment, a variable current source is coupled to the first current control input node to generate a plurality of frequencies from the oscillator.

In another embodiment, parasitic capacitances of the operational transconductance amplifier are used to generate oscillation.

Another embodiment of the disclosure includes a current controlled operational transconductance amplifier based sinusoidal oscillator circuit, including: a first power supply node; a first ground node; a first voltage control input node; a first output node; a variable resistor having a second input node and a second output node, wherein the second input node coupled to the first voltage control input node; an operational transconductance amplifier having:

a second power supply node coupled to the first power supply node of the voltage controlled operational transconductance amplifier based sinusoidal oscillator; a second ground node coupled to the first ground node of the voltage controlled operational transconductance amplifier based sinusoidal oscillator; a first non-inverting input coupled to the second ground node; a third voltage input node coupled to the second output node of the resistor; a first inverting input node, a third output node coupled to the first inverting input node and the first output node of the voltage controlled operational transconductance amplifier based sinusoidal oscillator.

In one embodiment, a DC voltage source is coupled to the first voltage control input node.

In another embodiment, a resistance of the variable resistor is adjusted to generate a plurality of frequencies from the oscillator In another embodiment, parasitic capacitances of the operational transconductance amplifier are used to generate oscillation.

DETAILED DESCRIPTION OF THE PRESENT EMBODIMENTS

This disclosure presents a minimum component sinusoidal oscillator circuit using one operational transconductance amplifier (OTA) and no externally connected passive components. The frequency of oscillation of the proposed circuit can be electronically tuned by means of a control current. For the frequency of oscillation of the proposed circuit to be controlled by an external voltage an additional externally connected resistor must be used. Thus, the proposed sinusoidal oscillator circuits use one OTA and at most one externally connected resistor.

A new minimum component current controlled operational transconductane amplifier (OTA)-based sinusoidal oscillator circuit is presented. The proposed circuit uses only one OTA and its frequency of oscillation can be controlled by the auxiliary bias current. If the auxiliary bias current is obtained directly then the proposed circuit uses only one OTA. If the auxiliary bias current is obtained from the negative terminal of the DC supply voltage then an additional externally connected resistor is needed. In this case the proposed circuit uses only one OTA and one external passive element. Experimental results are presented to confirm the workability of the proposed circuit.

Figure 1:
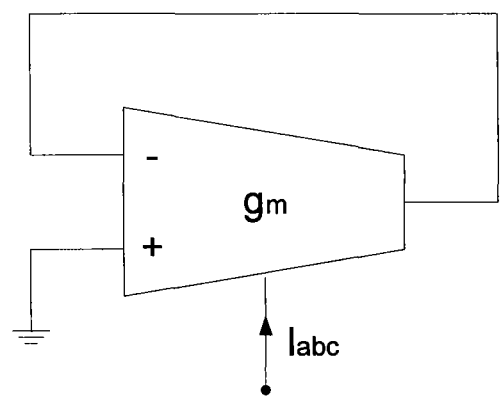
FIG. 1 is a schematic drawing of a proposed sinusoidal oscillator circuits with a variable input current source

The proposed circuit is shown in FIG. 1. The circuit comprises one active element, the OTA. Assuming that the OTA can be modeled by the non-ideal model shown in FIG. 2, with the transconductance $g_m$ expressed by the two-poles model of equation (1) as described in Bowron et al., ("Modeling of nonideal active devices in continuous-time OTA-C filters", Proceedings of the European Conference on Circuit Theory and Design, 1989, pp. 128-131—incorporated herein by reference):

$$g_m = \frac{g_{m0}}{\left(1 + \frac{s}{\omega_1}\right)\left(1 + \frac{s}{\omega_2}\right)} \tag{1}$$

where $\omega_1$ is the first pole of two-poles model of OTA, $\omega_2$ is the second pole of two-poles model of OTA, $g_m$ is the equivalent transconductance of the two-poles OTA at all operating frequency, $g_{m0}$ is the low frequency transconductance of the OTA (without considering the poles).

Figure 2:
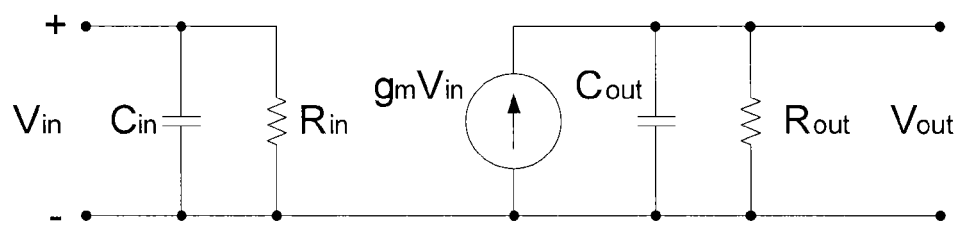
FIG. 2 is a schematic drawing of an equivalent circuit of the operational transconductance amplifier.

FIG. 2 show the simplified equivalent circuit of OTA, where $C_{in}$ is the equivalent input capacitance present at the input of the OTA, $R_{in}$ is the equivalent input resistance present at the input of the OTA, $V_{in}$ is the input differential voltage of the OTA, $C_{out}$ is the equivalent output capacitance present at the output of the OTA, $R_{out}$ is the equivalent output resistance present at the output of the OTA, $V_{out}$ is the output differential voltage of the OTA.

The characteristic equation of the proposed oscillator circuit can be expressed as $$\frac{-g_{m0}R_{out} // R_{in}}{\left(1 + \frac{s}{\omega_1}\right)\left(1 + \frac{s}{\omega_2}\right)\left(1 + \frac{s}{\omega_3}\right)} = 1 \tag{2}$$

Where $\omega_1$ is the first pole of two-poles model of OTA, $\omega_2$ is the second pole of two-poles model of OTA, $$\omega_3 = \frac{1}{(C_{in} + C_{out})(R_{in} // R_{out})},$$

$R_{in}$ is the equivalent input resistance present at the input of the OTA, $R_{out}$ is the equivalent output resistance present at the output of the OTA.

Figure 3:
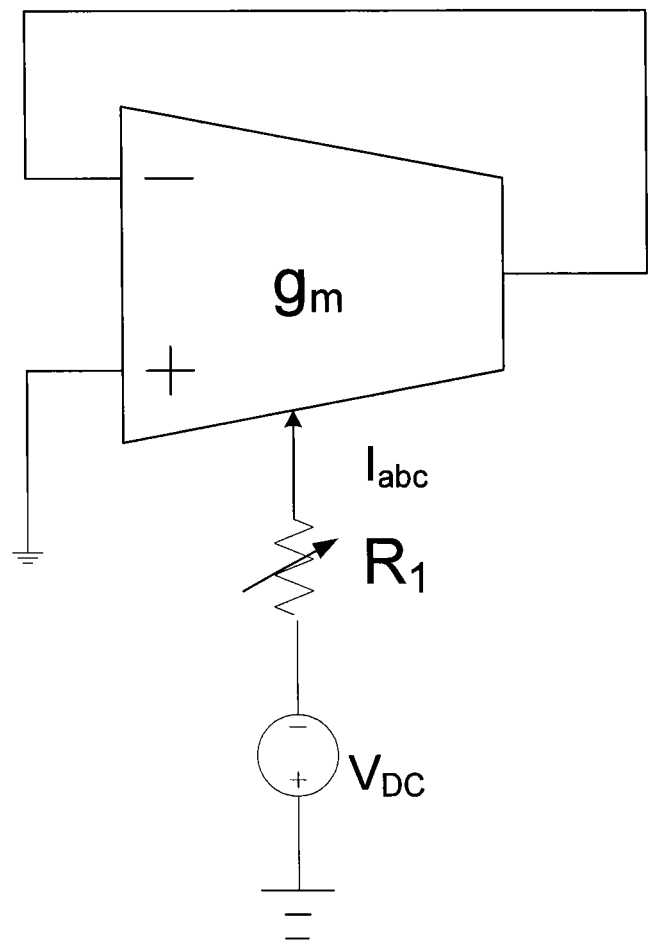
FIG. 3 is a schematic drawing of a proposed sinusoidal oscillator circuits with a variable resistor and a DC voltage source.

Using the Barkhausen criterion, that is, the loop gain which includes OTA and the feedback path to be at least 1 and the total loop phase be zero degrees or $2\pi n$ radians, where n is an integer, at the operating frequency of the oscillator, the equation (2) yields the frequency and condition of oscillation given by equations (3) and (4).

$$\omega_0^2 = \frac{1 + g_{m0}R_{out} // R_{in}}{\frac{1}{\omega_1\omega_2} + \frac{1}{\omega_2\omega_3} + \frac{1}{\omega_1\omega_3}} \tag{3}$$

$$\frac{1 + g_{m0}R_{out} // R_{in}}{\frac{1}{\omega_1\omega_2} + \frac{1}{\omega_2\omega_3} + \frac{1}{\omega_1\omega_3}} = \omega_1\omega_2 + \omega_2\omega_3 + \omega_1\omega_3 \tag{4}$$

where $\omega_0$ is the oscillation frequency of the proposed sinusoidal oscillator circuit. Equations (3) and (4) clearly show that the frequency of oscillation can be controlled by adjusting the transconductance $g_{m0}$. Since the transconductance $g_{m0}$ is a function of the auxiliary bias current $I_{abc}$, then the frequency of oscillation of the proposed circuit of FIG. 1 enjoys the attractive feature of electronic control using the auxiliary bias current. Moreover, the frequency of oscillation of the proposed circuit of FIG. 1 can be controlled by adjusting a control voltage as shown in FIG. 3. In FIG. 3, an external resistor $R_1$ is connected between the auxiliary bias current terminal and a DC voltage source. Thus, the proposed circuit of FIG. 3 enjoys also the attractive feature of electronic control using an externally connected voltage.

Figure 4:
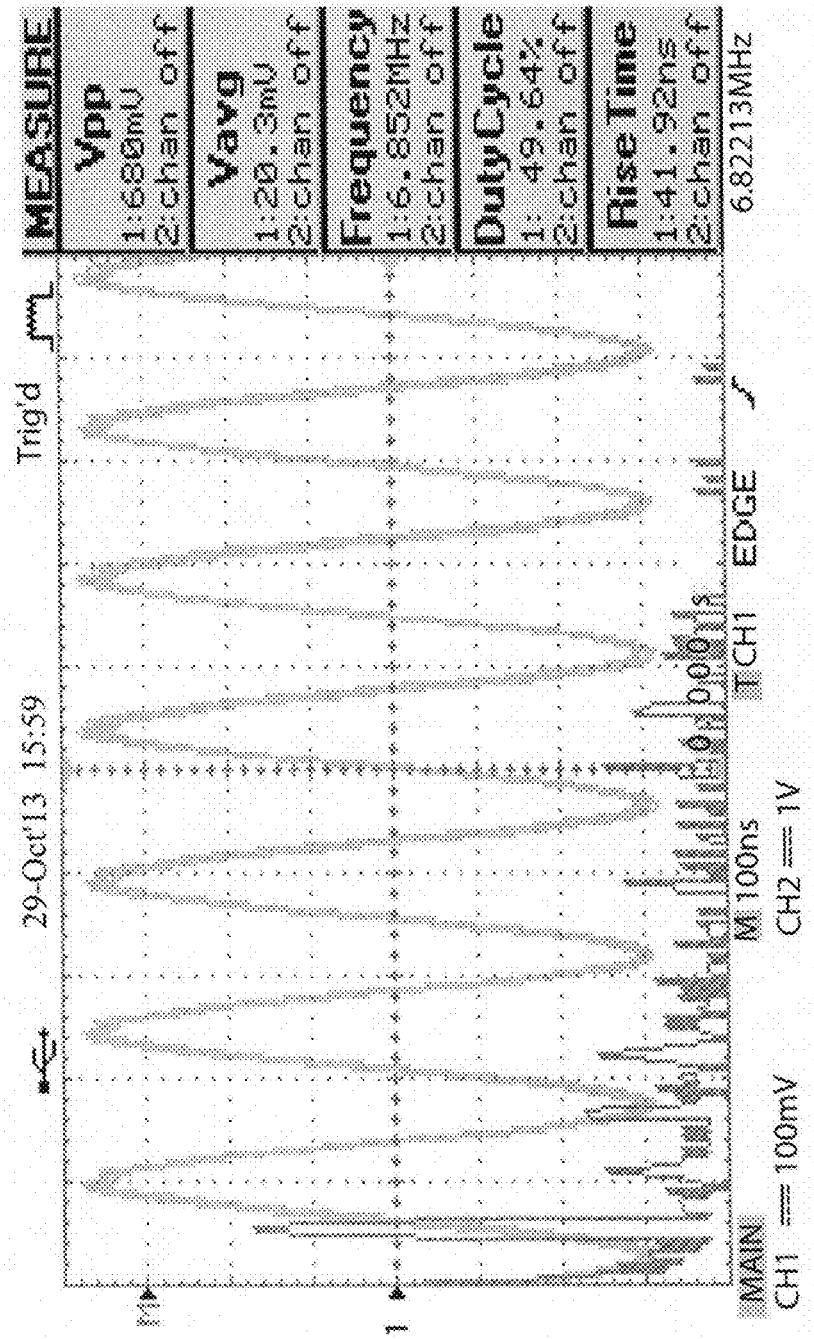
FIG. 4 is a plot of output waveform and spectrum obtained from the FIG. 1.

The proposed circuit of FIG. 1 was experimentally tested using the CA3080, as described in Intersil, ("Application of the CA 30890 High Performance Operational Transconductance Amplifiers," CA 3080 Application Notes, —incorporated herein by reference) with DC supply voltage=±12 V. A typical output waveform is shown in FIG. 4 with frequency=6.852 MHz and peak-to-peak voltage=0.68 V. FIG. 4 shows also the spectrum of the obtained oscillation. Table 1 describes the variation of the frequency of oscillation with the externally connected resistor in the auxiliary bias current terminal of the OTA wherein $V_{pp}$ is the output peak-to-peak voltage of the oscillator. It shows additional results obtained when a resistor $R_1$ is connected between the negative DC supply voltage $V_{DC}$ and the input terminal of the auxiliary current terminal. Inspection of Table 1 clearly shows the dependence of the frequency of oscillation on the variation of the externally connected resistor $R_1$ which affects the auxiliary bias current $I_{abc}$.

TABLE I

| R1(KΩ) | f (MHz) | Vpp (mV) |
|---|---|---|
| 47 | 4.453 | 250 |
| 33 | 5.092 | 316 |
| 20 | 5.887 | 468 |
| 15 | 6.334 | 540 |
| 10 | 6.80 | 672 |
| 8.2 | 6.97 | 760 |
| 5.6 | 6.688 | 1050 |
| 3 | 6.41 | 1520 |
| 2.4 | 6.35 | 1720 |

The invention claimed is:

1. A current controlled operational transconductance amplifier (OTA) based sinusoidal oscillator circuit comprising:
    a single active component consisting essentially of an OTA having
    an inverting input terminal;
    a non-inverting input terminal configured to be directly connected to ground;
    a current controlled input terminal configured to be connected to a current control source, wherein an auxiliary bias current is supplied from the current control source to the current controlled input terminal to control an oscillation frequency of the OTA; and
    an output terminal configured to be directly connected to the inverting terminal.

2. The current controlled operational transconductance amplifier based sinusoidal oscillator circuit of claim 1, wherein an oscillation frequency of the current controlled operational transconductance amplifier based sinusoidal oscillator circuit is calculated according to:

$$\omega_0^2 = \frac{1 + g_{m0}R_{out} // R_{in}}{\frac{1}{\omega_1\omega_2} + \frac{1}{\omega_2\omega_3} + \frac{1}{\omega_1\omega_3}}$$

where $\omega_0$ is the oscillation frequency of the operational transconductance amplifier based sinusoidal oscillator circuit, $\omega_1$ is the first pole of two-poles model of the operational transconductance amplifier, $\omega_2$ is the second pole of two-poles model of the operational transconductance amplifier, $$\omega_3 = \frac{1}{(C_{in} + C_{out})(R_{in} // R_{out})},$$

$g_{m0}$ is the low frequency transconductance of the operational transconductance amplifier, Rin is the equivalent input resistance present at the input of the operational transconductance amplifier, Rout is the equivalent output resistance present at the output of the operational transconductance amplifier, Cin is the equivalent input capacitance present at the input of the operational transconductance amplifier, Cout is the equivalent output capacitance present at the output of the operational transconductance amplifier.

3. The current controlled operational transconductance amplifier based sinusoidal oscillator circuit of claim 1, further comprising:
    a variable resistor having a first terminal and a second terminal, wherein the first terminal is directly connected to a first voltage control terminal of a voltage source and wherein the second terminal is directly connected to the current controlled input terminal of the OTA.

4. The current controlled operational transconductance amplifier based sinusoidal oscillator circuit of claim 3, wherein the voltage source further comprises a second voltage control terminal configured to be directly connected to ground.

5. The current controlled operational transconductance amplifier based sinusoidal oscillator circuit of claim 1 further consisting one passive element.

6. The current controlled operational transconductance amplifier based sinusoidal oscillator circuit of claim 1 further consisting of at most one passive element.

7. A current controlled operational transconductance amplifier (OTA) based sinusoidal oscillator circuit consisting essentially of:
    a single OTA having
    an inverting input terminal;
    a non-inverting input terminal configured to be directly connected to ground;
    a current controlled input terminal configured to be connected to a current control source, wherein an auxiliary bias current is supplied from the current control source to the current controlled input terminal to control an oscillation frequency of the OTA; and
    an output terminal configured to be directly connected to the inverting terminal.

8. A method for generating an oscillation frequency comprising:
    using a single operational transconductance amplifier (OTA)
        directly connecting a non-inverting input terminal of the OTA to a ground terminal;
        generating a negative feedback loop to directly connect an output terminal of the OTA with an inverting input terminal of the OTA; and
        electronically controlling the generation of an oscillation frequency by connecting a current controlled input terminal of the OTA directly to a current controlled source.

9. The method of claim 8, wherein the current controlled source further comprises a voltage source and an externally connected variable resistor such that the generated oscillation frequency is dependent on the variation of the variation of the externally connected resistor.

10. The method of claim 9, wherein the generated frequency has an inverse relationship with the externally connected variable resistor.

11. The method of claim 8, further comprising:
generating the oscillation frequency using 3 poles of the OTA such that:

$$\omega_0^2 = \frac{1 + g_{m0} R_{out} // R_{in}}{\frac{1}{\omega_1 \omega_2} + \frac{1}{\omega_2 \omega_3} + \frac{1}{\omega_1 \omega_3}}$$

where $\omega_0$ is the oscillation frequency of the operational transconductance amplifier based sinusoidal oscillator circuit, $\omega_1$ is the first pole of two-poles model of the operational transconductance amplifier, $\omega_2$ is the second pole of two-poles model of the operational transconductance amplifier, $\omega_3$ is the third pole from the controlled operational transconductance amplifier based sinusoidal oscillator circuit, $g_{m0}$ is the low frequency transconductance of the operational transconductance amplifier, Rin is the equivalent input resistance present at the input of the operational transconductance amplifier, Rout is the equivalent output resistance present at the output of the operational transconductance amplifier.

* * * * *